United States Patent [19]

Ilani

[11] Patent Number: 5,633,596
[45] Date of Patent: May 27, 1997

[54] FIXTURELESS AUTOMATIC TEST EQUIPMENT AND A METHOD FOR REGISTRATION FOR USE THEREWITH

[75] Inventor: Avner Ilani, Kiron, Israel

[73] Assignee: Key Solutions Ltd., Kiron, Israel

[21] Appl. No.: 370,067

[22] Filed: Jan. 9, 1995

[30] Foreign Application Priority Data

| Jan. 11, 1994 | [IL] | Israel | 107550/2 |
| Jan. 11, 1994 | [IL] | Israel | 107550/3 |
| Aug. 24, 1994 | [IL] | Israel | 107550/4 |

[51] Int. Cl.⁶ .................................. G01R 31/28
[52] U.S. Cl. ........................................ 324/754
[58] Field of Search .................... 324/754, 756, 324/757, 758

[56] References Cited

U.S. PATENT DOCUMENTS

| 4,587,481 | 5/1986 | Lischke et al. ................ 324/73 |
| 4,929,893 | 5/1990 | Sato et al. ..................... 324/754 |
| 4,966,520 | 10/1990 | Yokota et al. ................. 414/786 |
| 5,363,038 | 11/1994 | Love ............................. 324/158.1 |
| 5,506,510 | 4/1996 | Blumenau ..................... 324/754 |

*Primary Examiner*—Kenneth A. Wieder
*Assistant Examiner*—Barry C. Bowser
*Attorney, Agent, or Firm*—Mark M. Friedman

[57] ABSTRACT

Fixtureless automatic test equipment for testing a printed wiring board having electrically conductive elements. The automatic test equipment of the present invention includes an array of modular integrated switching circuit (MISC) devices and test instrumentation fore determining the functionality of a workpiece. Each MISC includes an array of semiconductor dies mounted on a PWB interconnector for kiss touch deployment on a workpiece. All the PWB interconnectors form a test mattress of probes for deployment against a bare workpiece. Each semiconductor die includes a matrix of switching cells of which each switching cell terminates in a terminal. The PWB interconnector of each MISC connects the switching cell terminals to probes forming part of the test mattress.

17 Claims, 6 Drawing Sheets

FIG. 2a
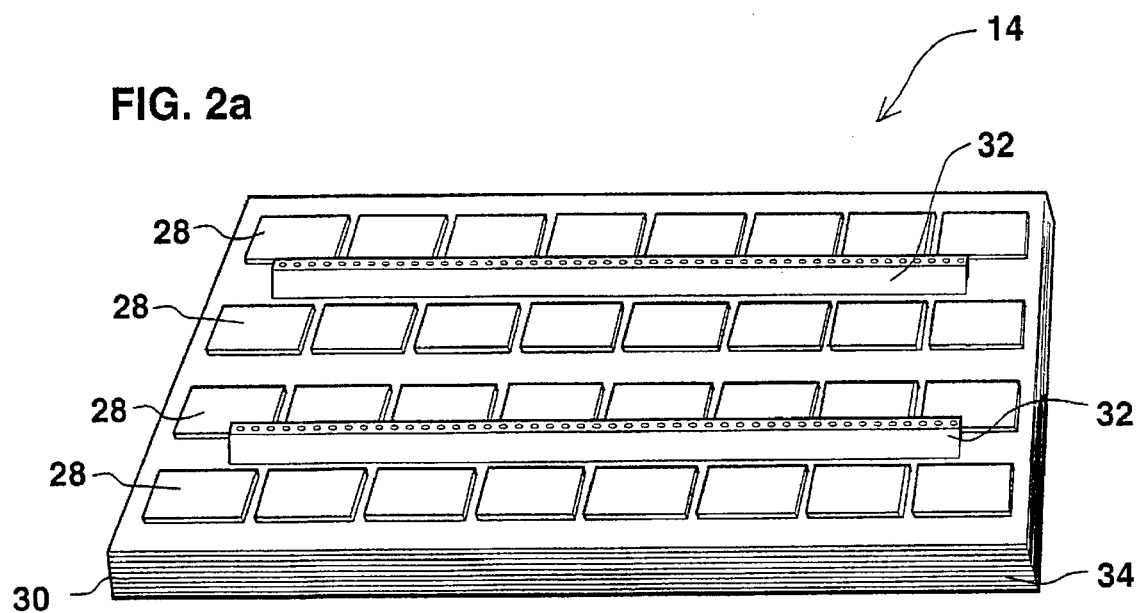
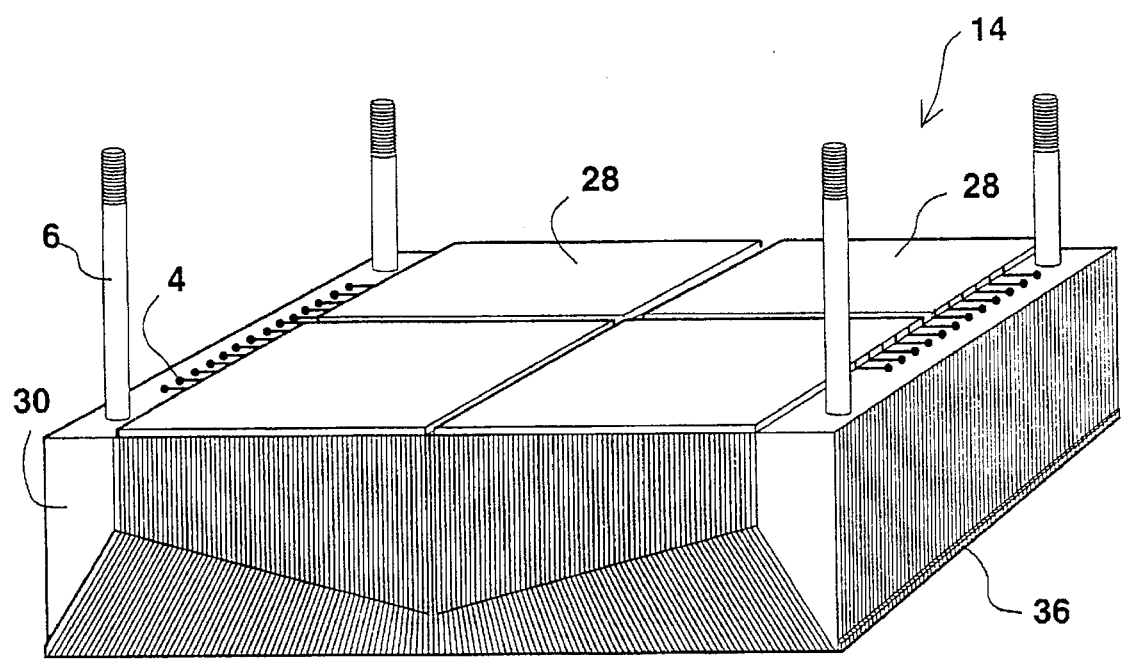
FIG. 2b

FIXTURELESS AUTOMATIC TEST EQUIPMENT AND A METHOD FOR REGISTRATION FOR USE THEREWITH

FIELD AND BACKGROUND OF THE INVENTION

The present invention relates to automatic test equipment for testing and verifying bare workpieces realized as printing wiring boards (PWBs), integrated circuit semiconductor dies (ICs), and the like. The present invention also relates to a method for registration for use with the automatic test equipment.

Bare workpieces are commonly tested with a variety of automatic test equipment which verify different aspects of functionality such as continuity, insulation resistance, detection of undesirable opens and shorts, improper connections, etc. Generally speaking, automatic test equipment can be classified as follows: Automatic Optical Inspection (AOI) systems for inspecting inner layers of workpieces and Ohmic test systems for the final testing of a manufactured workpiece. In other words, the AOI systems and the Ohmic test systems complement one another in the testing of workpieces.

Ohmic test systems can be generally divided into two types of systems: bed of nails systems or flying probe systems.

Bed of nails systems typically employ bulky fixtures with either rigid metallic probes or spring-loaded, gold-plated probes. In both cases, the systems require high static pressure to ensure reliable contact between the probes and test points on the workpieces. Such systems suffer from a number of disadvantages. First, the rigid metallic probes, and even the delicate spring-loaded probes, often leave witness marks, such as notches and cavities, due to the high static pressure which may, in turn, cause a high rejection rate due to the necessity for compliance with strict standards. Second, the high static pressure frequently causes false shorts between adjacent probes especially when the tested board is crowded with fine-pitch shapes. Third, in case that expensive standard fixtures are not used, each workpiece requires a dedicated fixture which imposes a considerable burden on the total manufacturing cost of workpieces, especially in the case of small lots or prototypes. Fourth, test points are sometimes deleted because their locations are difficult or expensive to probe and therefore, in many cases, fixtures do not provide full coverage of a workpiece. Fifth, single terminal nets, such as fudicials cannot be tested by single probe contact. Sixth, the test switching process is done using a large number of plug-in switch cards which reside remote from the test probes, thereby requiring complex electrical cabling.

Flying probe systems employ probes displaceable along the X and Y axes. These systems suffer from the disadvantages that they can only cope with modest-sized lots due to their poor throughput and that moving parts are well known in the industry for their frequent problems.

There is therefore a need for automatic test equipment for verifying different aspects of bare workpieces which overcome the disadvantages of existing automatic test equipment and a method for registration between a test mattress of the automatic test equipment and a bare workpiece placed randomly on the test mattress.

SUMMARY OF THE INVENTION

The present invention is for fixtureless automatic test equipment for testing and verifying bare workpieces realized as printed wiring boards (PWBs), integrated circuits semiconductor (ICs) and the like and for a method for registration between a test mattress of the automatic test equipment and a bare workpiece placed randomly on the test mattress.

Hence, according to the teachings of the present invention, there is provided a fixtureless automatic test equipment for testing the electrical connectivity between electrically conductive elements of a workpiece, the automatic test equipment comprising: (a) at least one semiconductor die, the die having: i) a matrix of terminals of which a pair of the terminals contacts one or two of the electrically conductive elements of the workpiece, and ii) switching apparatus for electrically connecting the pair of the terminals through the die; and (b) test equipment connected to the die for determining the electrical connectivity through the workpiece between the one or two of the electrically conductive elements of the workpiece contacted by the pair of terminals.

According to a further feature of the present invention, the equipment further comprising a test mattress of electrically conductive probes of which a probe is connected to a terminal of the matrix of terminals.

According to a still further feature of the present invention, the test mattress of electrically conductive probes includes elastomeric electrically conductive bumps.

According to a yet still further feature of the present invention, the test mattress of electrically conductive probes includes substantially rigid electrically conductive bumps with a flex cushion deployed between the rigid electrically conductive bumps and the workpiece.

According to a yet still further feature of the present invention, the probes of the test mattress of electrically conductive probes are arranged in a double density arrangement.

According to a yet still further feature of the present invention, the test mattress of electrically conductive probes includes horizontally deployed printed circuit boards.

According to a yet still further feature of the present invention, the test mattress of electrically conductive probes includes vertically deployed printed circuit boards.

According to a yet still further feature of the present invention, the equipment further comprising a registration module for registration between the matrix of electrically conductive terminals and the workpiece randomly placed relative thereto.

According to a yet still further feature of the present invention, at least two terminals contact an electrically conductive element of the workpiece so as to enable testing of the element.

According to a yet still further feature of the present invention, the semiconductor die includes a plurality of switching cells, each of the switching cells having a bi-directional switch and a control latch for determining the switching cell to be either an input port or an output port.

There is also provided according to the teachings of the present invention, a method for registration between a test mattress of automatic test equipment and a workpiece under test, the method comprising the steps of: (a) providing a reference point of the test mattress; (b) providing a reference file of the workpiece, the reference file including X and Y coordinates of the elements of the workpiece relative to a reference point of the workpiece; (c) determining an X-offset of the workpiece relative to the reference point of the test mattress; (d) determining an Y-offset of the workpiece relative to the reference point of the test mattress; (e) determining a placement angle of the workpiece relative to the test mattress; and (f) updating the X and Y co-ordinates of the elements of the workpiece in the reference file of the workpiece such that the X and Y cordinates are relative to the reference point of the test mattress.

BRIEF DESCRIPTION OF DRAWINGS

The invention will be described by reference to, but without limitation to, the presently preferred illustrations and embodiments thereof, of which:

FIGS. 2a and 2b are schematic views of two embodiments of a Modular Integrated Switching Circuit (MISC) of the fixtureless automatic test equipment of FIG. 1;

DETAILED DESCRIPTION OF THE INVENTION

The present invention is for automatic test equipment for testing and verifying bare workpieces realized as printed wiring boards (PWBs), integrated circuit semiconductor dies (ICs), and the like and a method for registration between a test mattress of the automatic test equipment and a bare workpiece placed randomly on the test mattress.

The principles and operation of the automatic test equipment and the method for registration of the present invention may be better understood with reference to the drawings and the accompanying description.

Generally speaking, the automatic test equipment of the present invention includes an array of modular integrated switching circuit (MISC) devices and test instrumentation for testing the functionality of a workpiece. Each MISC includes an array of semiconductor dies mounted on a PWB interconnector for kiss touch deployment on a workpiece. The PWB interconnectors are employed to isolate the fragile semiconductor dies from any pressure applied against the workpiece. All the PWB interconnectors form a test mattress of probes for deployment against a bare workpiece. Each semiconductor die includes a matrix of switching cells of which each switching cell terminates in a terminal. The PWB interconnector of each MISC connects the switching cell terminals to probes forming part of the test mattress.

It is a particular feature of the present invention that the automatic test equipment enables the testing and verifying of the functionality of a workpiece without the precise deployment of the workpiece relative to the test mattress. This is achieved by determining the location and the orientation of the randomly placed workpiece relative to a reference point of the test mattress by means of a registration algorithm. Thereafter, the reference files describing the net of the workpiece are updated such that any X- and Y-offsets and placement angle of the workpiece relative to the test mattress are compensated. Thus, it can be readily appreciated that the novel registration technique obviates the need for expensive robotics equipment and optical-alignment instrumentation.

Figure 1:
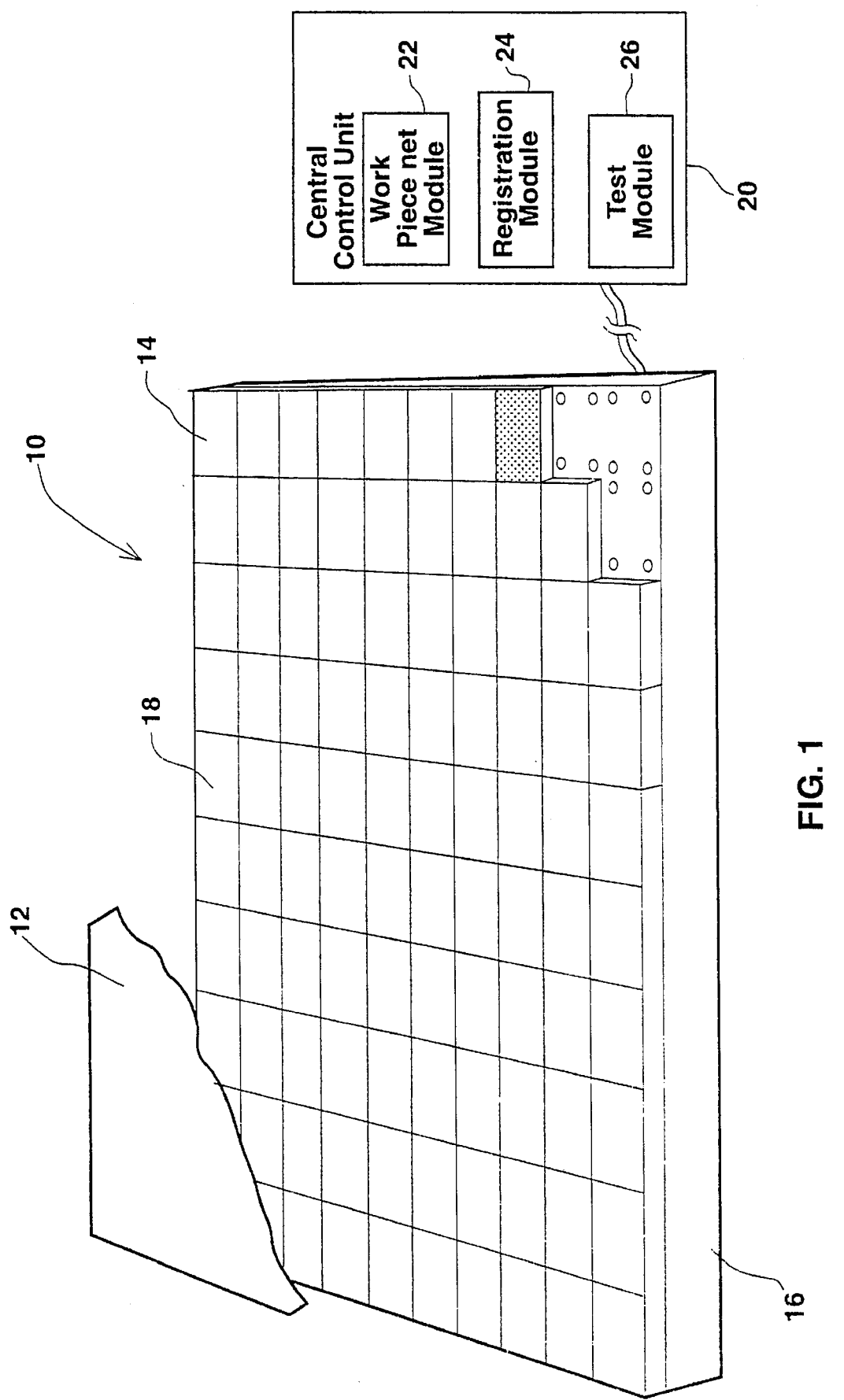
FIG. 1 is a schematic view of a fixtureless automatic test equipment, constructed and operative according to the teachings of the present invention, for testing and verifying a bare workpiece under test.

Referring now to the drawings, FIG. 1 illustrates automatic test equipment, generally designated 10, constructed and operative according to the teachings of the present invention, for testing a workpiece 12. Workpiece 12 can be a printed wiring board (PWB), an integrated circuit semiconductor die, and the like. For the sake of exposition, automatic test equipment 10 is implemented for testing and verifying the bottom side of a bare workpiece. However, it should be noted that automatic test equipment 10 can be implemented for testing and verifying both the top side and the bottom side of a bare double sided workpiece.

Automatic test equipment 10 includes an array of modular integrated switching circuit (MISC) devices 14 plugged into a chassis 16 so as to render a test mattress 18 for kiss touch deployment against workpiece 12. MISCs 14 communicate with a controller unit 20, preferably realized as a computer, which typically includes the following modules: First, a workpiece net module 22 for storing the nets of workpieces 12 to be tested by automatic test equipment 10. Second, a registration module 24 for enabling the registration between chassis 16, and therefore test mattress 18, and workpiece 12. And lastly, a test module 26 for testing and verifying different aspects of functionality of workpiece 12 such as continuity, insulation resistance, detection of undesirable opens and shorts, improper connections, etc.

With reference now to FIGS. 2a and 2b, each MISC 14 includes an array of semiconductor dies 28 mounted on a PWB interconnector 30 and connected to one or more communication ports 32 for connection to controller unit 20. Hence, in actual fact, test mattress 18 is, in effect, an array of PWB interconnectors 30 deployed side by side. PWB interconnectors 30 can be implemented by either horizontally deployed printed circuit boards 34 (FIG. 2a) or vertically deployed printed circuit boards 36 (FIG. 2b). It should be noted that the configuration of PWB interconnector 30 shown in FIG. 2b is particularly useful for testing and verifying workpieces 12 at high frequencies due to the elimination of vias of two 90° turns which badly affect test results of workpieces designed to withstand high frequency applications.

Figure 3:
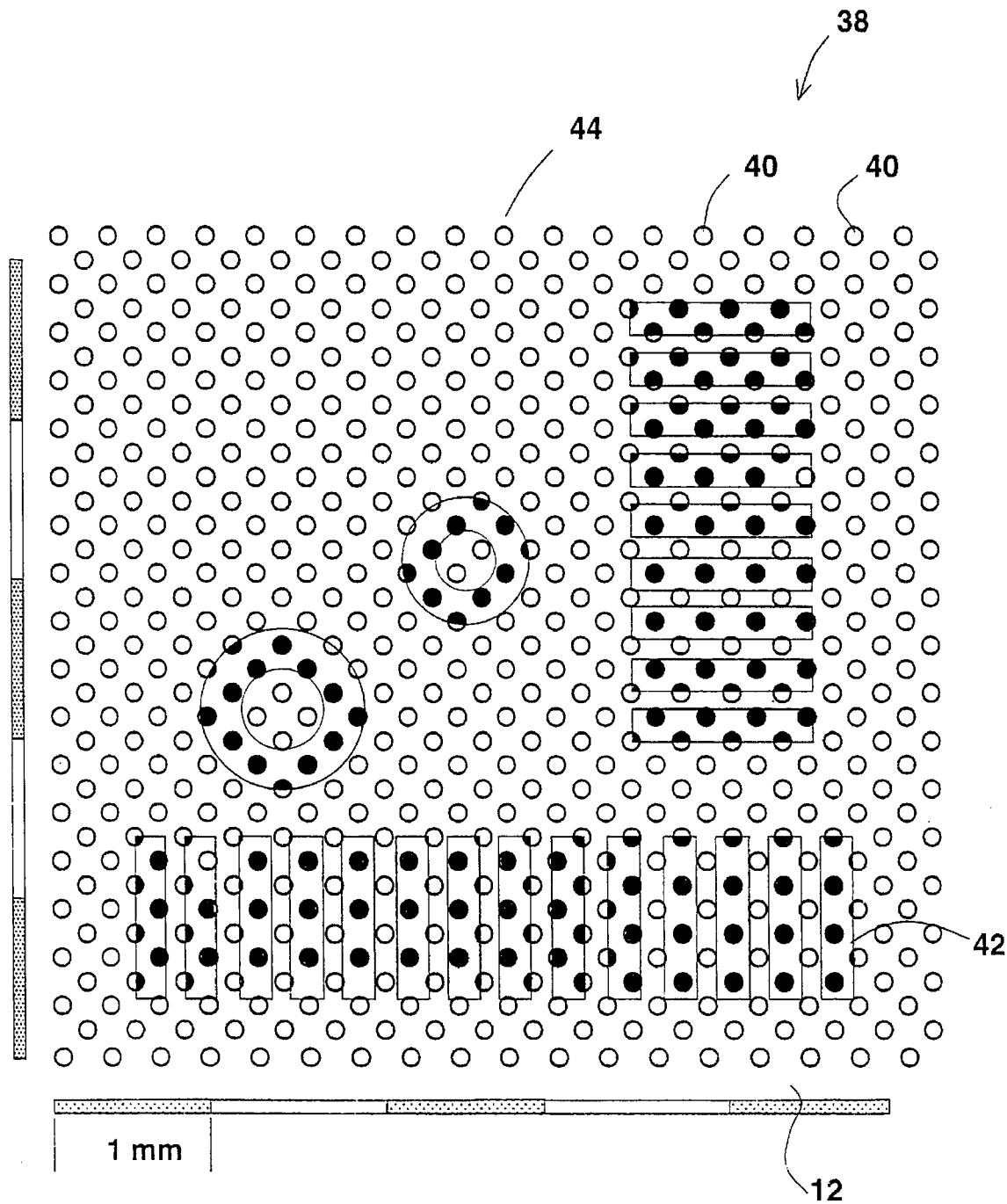
FIG. 3 is a schematic view of the footprints of a test mattress of the automatic test equipment of FIG. 1 on the pads of a workpiece under test.

With reference now to FIG. 3, each PWB interconnector 30 includes a matrix of probes, generally designated 38, on its exposed side for deployment against workpiece 12. Probes 40 of matrix 38 are preferably arranged according to a double density arrangement of staggered rows of probes so as to achieve a higher probe density. As will be described hereinbelow with reference to FIG. 4, each probe 40 of PWB interconnector 30 is connected to a terminal of a switching cell implemented in a semiconductor die 28.

Matrix 38 is preferably realized according to one of the following two techniques: First, by realizing probes 40 as elastomeric electrically conductive bumps such that the bumps themselves can accommodate different object heights depending on the degree that they are compressed. Typically bumps are prepared from conductive elastomeric polymer applied using precise screen printing technology. For more information about this technique, reference is made to US patents assigned to Epoxy Technology Ltd., U.S.A. and other material in the public domain from Epoxy Technology Ltd., U.S.A., which is incorporated herein by reference. It is well known that bumps prepared by this technique are micronic and can be arranged in a high bump density.

Alternatively, by realizing probes 40 as rigid cones which are then spaced from workpiece 12 by a relatively thin cushion (not shown) made up of an insulating silicon rubber sheet with silver particles embedded therein. Such cones are prepared through a process known in the art as the grown gold-dot process. For more information about this technique, reference is made to U.S. Pat. No. 4,125,310 for a Gold Dot Interconnection System which is incorporated herein by reference. It is well known that cones prepared by this technique are small and can be arranged in a high bump density. In this case, it should be noted that it is the cushion which is compressed to different thicknesses to accommodate different objects heights.

All in all, test mattress 18 achieves the following objectives: First, that probes 40 achieve reliable contact with all the elements of workpiece 12 notwithstanding their non-uniform object heights while ensuring that adjacent probes 40 do not short each other when test mattress 18 is deployed against workpiece 12. Second, that probes 40 do not leave witness marks and physical damages such as notches and cavities on workpiece 12. Third, that the dimensions of probes 40 are such that a single probe cannot short two adjacent elements of workpiece 12. Fourth, that the probe density of probes 40 is such that at least two probes are in contact with each and every tested pad on workpiece 12 to enable testing of single-terminal nets and to provide no false-open reporting as may happen in a single-probe touch. And lastly, enable optimization of the pressure applied on workpiece 12.

As can be clearly seen in FIG. 3, the footprints of probes 40 are depicted relative to a typical feature layout of workpiece 12 so as to clearly illustrate the kiss touching of at least two probes 40 on a single element realized as either SMD pads 42 or thru-hole pads 44. The footprints of probes 40 which are in electrical contact with one of the features of workpiece 12 are shown dark while, in contrast, the footprints of probes 40 which are not in electrical contact with features of workpiece 12 are shown light.

Figure 4:
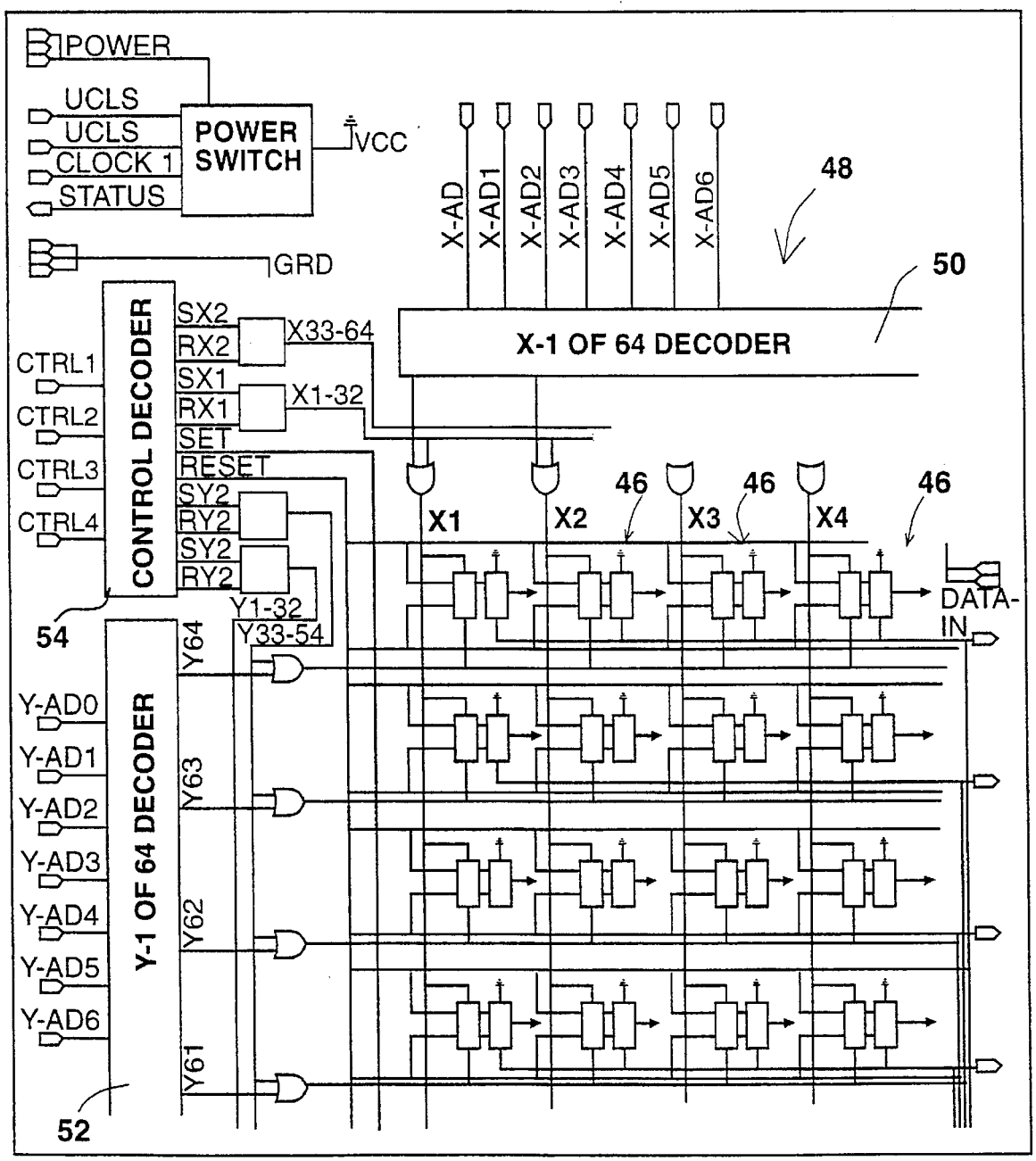
FIG. 4 is an electrical schematic view of a portion of a semiconductor die of the MISC of FIG. 2.

With reference now to FIG. 4, each semiconductor die 28 is a novel dedicated ASIC manufactured using conventional semiconductor die fabrication technology for enable in-place switching between switching cells 46 of a matrix of switching cells, generally designated 48. Typically, a semiconductor die 28 includes a 64×64 matrix 48 providing a total of 4096 switching cells 46, however, the size of matrix 48 can be varied depending on the application at hand and optimization strategy.

Furthermore, each semiconductor die 28 includes a X-axis decoder 50 for providing an X-axis address, a Y-axis decoder 52 for providing a Y-axis address and a control decoder 54 for determining the logic state of switching cells 46. It should be noted that each switching cell 46 is addressed by addressing its column line and its row line either singly or in combination with other column lines or row lines. In the case that multiple row lines are addressed, then only one column line can be addressed so as to select all the switching cells in that column. Alternatively, in the case that multiple column lines are addressed, then only one row line can be addressed so as to select all the switching cells in that row.

Figure 5:
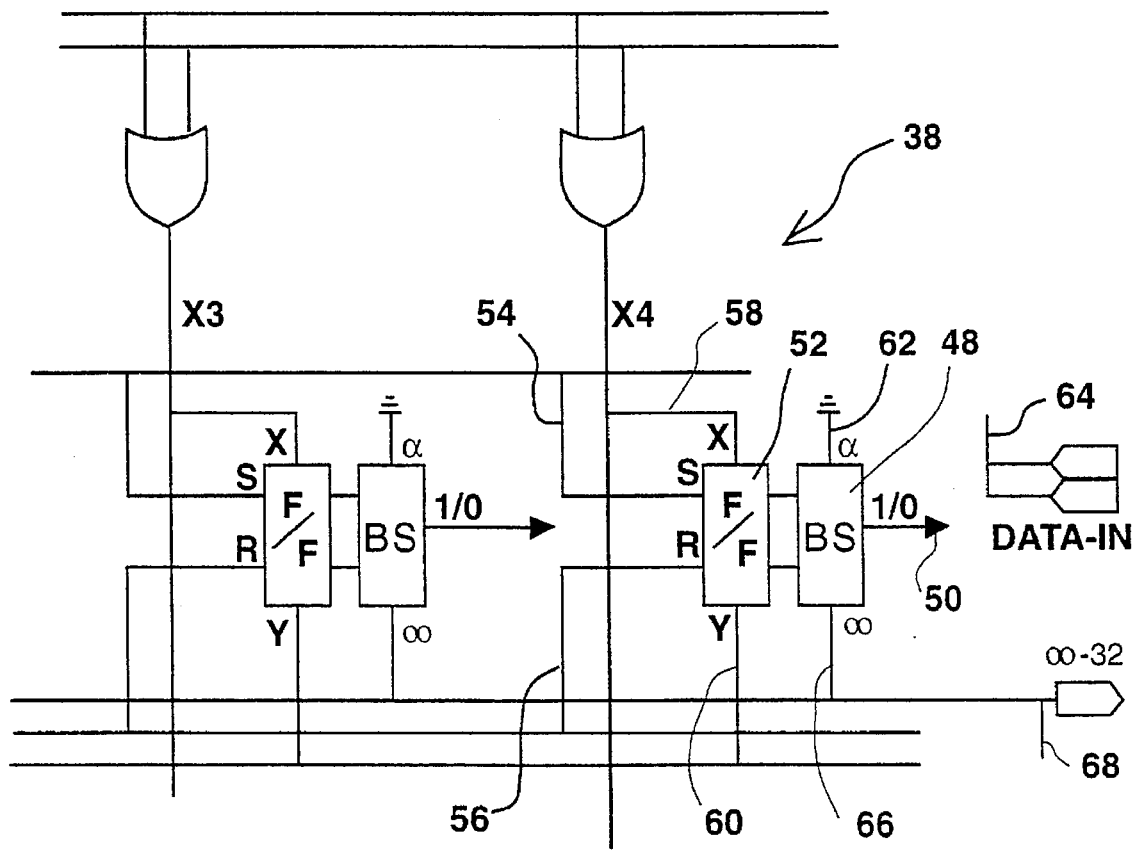
FIG. 5 is a close-up view of a switching cell of the semiconductor die of FIG. 4.

With reference now to FIG. 5, each switching cell 46 is implemented as a Bi-directional Switch (BS) 56 having an input/output (I/O) terminal 58 and a control latch 60 such that each switching cell 38 can be set as an input port or as an output port. For the sake of exposition only, each switching cell 38 is realized as two three-state analog switches having SET (S) and RESET (R) inputs 62 and 64, respectively, connected to control decoder 54, an X-address input 66 connected to X-address decoder 50, a Y-address input 68 connected to Y-address decoder 52, a DATA-IN (DI) terminal 70 connected to a data in line 72 which is, in turn, connected to controller unit 20 and a DATA-OUT (DO) terminal 74 connected to a data out line 76 which is, in turn, connected to controller unit 20.

The preferable conventional employed in automatic test equipment 10 is as follows: Logic state "1" indicates an electrical connection through workpiece 12 between a pair of switching cells 38 in contact with one or two of the electrically conductive elements on workpiece 12. And, logic state "0" indicates an electrical break through workpiece 12 between a pair of switching cells 38 in contact with one or two of the electrically conductive elements on workpiece 12.

As will become evident hereinbelow, a pair of switching cells 38 can be in contact with the same element on workpiece 12 or on different elements on workpiece 12 which are electrically connected. Furthermore, one of the pair of switching cells 38 can be on a first semiconductor die 28 while the other of the pair of switching cells 38 can be on a second semiconductor die 28.

Figure 6:
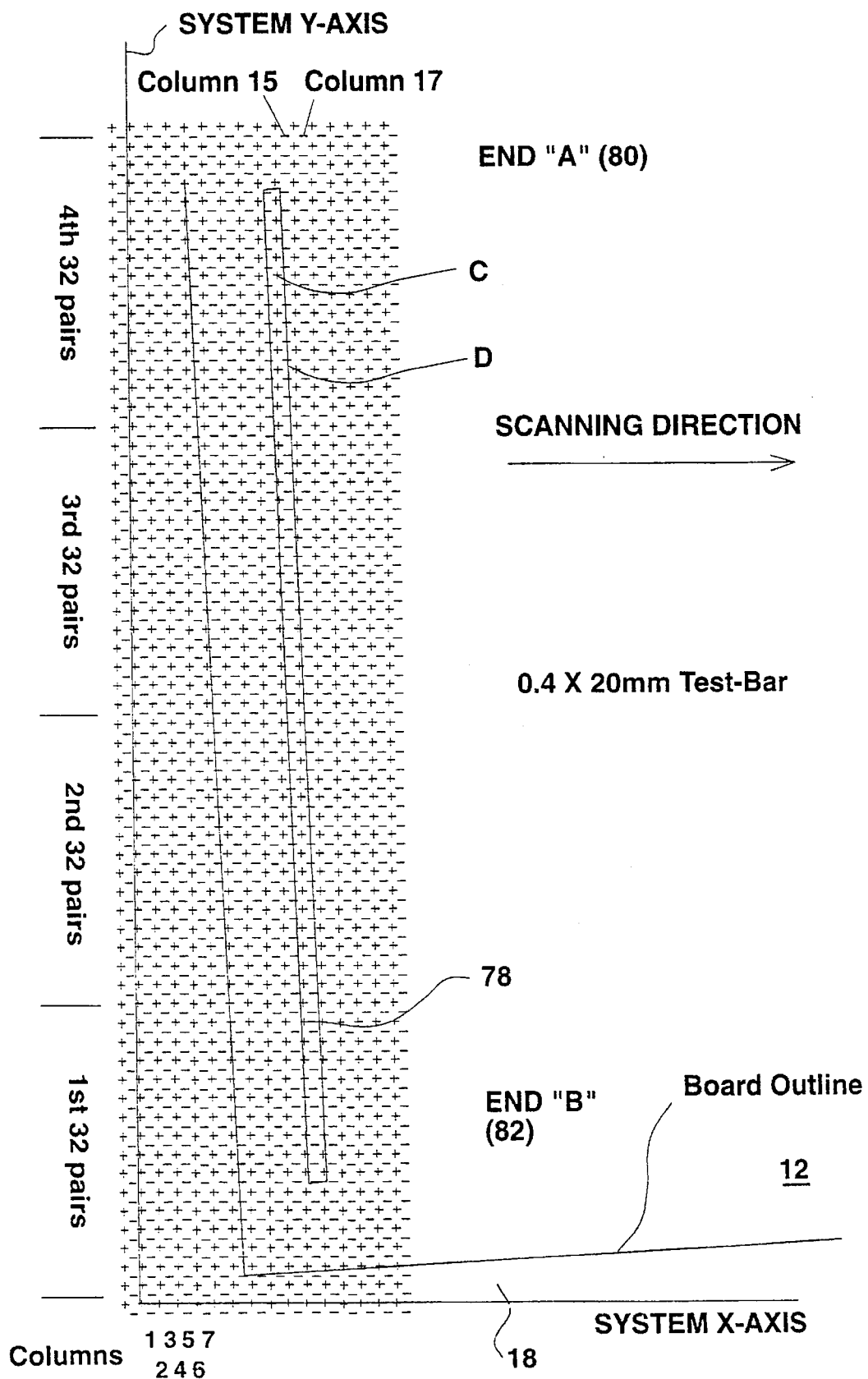
FIG. 6 is a schematic view of a test bar added to a workpiece under test for use in a novel registration algorithm enabling the registration between the workpiece and the test mattress of the automatic test equipment.

The operation of automatic test equipment 10 is now described with reference to FIG. 6. First, automatic test equipment 10 is set up to test and verify a particular workpiece 12 under test. The set-up includes determining the size of test mattress 18 required to overlay workpiece 12, loading the net of workpiece 12 into workpiece net module 22 and loading the required functionality tests into test module 26.

Second, the registration between workpiece 12 and test mattress 18 has to be determined before the functionality testing and verifying of workpiece 12 can be initiated. The registration is achieved by any registration algorithm designed to determine the location and the orientation of workpiece 12 relative to test mattress 18. It should be noted that in the case that workpiece 12 is placed precisely at the origin of the reference coordinate system and the placement angle is 0°, then the X;Y values in workpiece net module 22 do not have to be updated.

For the sake of exposition only, the registration algorithm described hereinbelow uses one or more test bars deployed on workpiece 12 such that they are the first elements on workpiece 12 to be encountered when scanning workpiece 12. Broadly speaking, the registration algorithm systematically addressing adjacent switching cells 38 until registration module 24 detects the starting and finishing ends of the test bars so as to provide X and Y-value offsets relative to a reference co-ordinate system and a placement angle.

Typically, one of the test bars is preferably a straight bar extending from the bottom leftmost possible location along the Y-axis whereas the second test bar is a straight bar extending from the top rightmost possible location along the X-axis. A typical test bar 78 having an end "A" 80 and an end "B" 82 is depicted on workpiece 12. As will become apparent hereinbelow, the designation of ends "A" and "B" as the start and finish ends of test bar 78 is dependent on the orientation of workpiece 12 relative to the reference point of test mattress 18. Furthermore, it will also be readily appreciated that the longer the test bars so the more accurate the registration results.

For test bar 78, scanning starts from left to right using the column-to-column addressing mode described hereinabove. Registration module 24 selects alternate columns to be a column of input ports depicted as "+" and a column of output ports depicted as "−". Registration module 24 continues to select alternate pairs of columns until the first connection between adjacent switching cells 38 is detected. In this case, the first connection between adjacent switching cells 38 is detected on selection of Columns 15 and 16. As shown, end "A" 80 is detected before end "B" due to the counter clockwise orientation of workpiece 12 relative to test mattress 18.

Thereafter, registration module 24 continues to scan adjacent pairs of switching cells 38 to determine the point at which there is no longer any electrical connection through workpiece 12. In this case, this occurs at the point depicted C. Registration module 24 then proceeds to select the next alternate pairs of columns until again, this time at point D, there is no longer any electrical connection through workpiece 12 through adjacent switching cells 38. This step like scanning process continues until such time that registration module 24 detects the last connection between adjacent switching cells 38. In this case, end "B" 82 is the finish end of test bar 78 and the last connection between adjacent switching cells 38 is detected on selection of Columns 21 and 22.

After the registration algorithm determines the linear X-value and Y-value offsets relative to a reference co-ordinate system and a placement angle, registration module 24 updates the X;Y values in workpiece net module 22 to such that the X;Y values resident in the reference file of workpiece 12 are relative to the reference point of test mattress 18. In other words, registration module 24 compares the detected X;Y values of the start point and finish points of test-bars with the X;Y values of the respective points in the reference file residing in PWB net module 22 and updates the X;Y values in the reference file residing in PWB net module 22 accordingly. Hence, it can be readily appreciated that it is a particular advantage of the present invention that automatic test equipment 10 does not require complex robotics and optical alignment equipment.

Third, the functionality testing of workpiece 12 is initiated by test module 26. Test module 26 is designed to perform a number of test as follows: First, an element test to verify that there is no electrical break along an element. The element test is achieved by selecting two probes on the same element and determining that one of the probes is the input port and the other probe is the output port. Second, a point-to-point net test to verify that there is no electrical break along a net between an input port and an output port. The point-to-point element test is achieved by selecting one probe on the input port of the net and a second probe on the output port of the net. And third, a point-to-"multi-point" test to verify that there is no electrical break along a net between an input port and more than one output ports. The point-to-"multi-point" test is achieved by selecting one probe on the input port of the net and a probe on each of the output ports of the net.

All in all, it can be readily appreciated that the automatic test equipment of the present invention renders a number of important advantages over conventional automatic test equipment. These advantages include close proximity of the switching function to the objects under test, a fixtureless system, a miniaturization of parts such that power usage and heat build-up can be greatly reduced, a far greater probe density, a superior signal-to-noise ratio, a wireless in-place switching facility, and others.

While the invention has been described with respect to a limited number of embodiments, it will be appreciated that many variations, modifications and other applications of the invention may be made.

What is claimed is:

1. A method for registration between a test mattress of automatic test equipment and a workpiece under test, the method comprising the steps of:

(a) providing a reference point of the test mattress;

(b) providing a reference file of the workpiece, the reference file including X and Y co-ordinates of the elements of the workpiece relative to a reference point of the workpiece;

(c) determining an X-offset of the workpiece relative to the reference point of the test mattress;

(d) determining an Y-offset of the workpiece relative to the reference point of the test mattress;

(e) determining a placement angle of the workpiece relative to the test mattress;

(f) updating the X and Y co-ordinates of the elements of the workpiece in the reference file of the workpiece such that the X and Y co-ordinates are relative to the reference point of the test mattress; and (g) testing the workpiece using said updated reference file of step (f).

2. An automatic test equipment for testing the functionality of any workpiece, comprising a mattress of test electrodes and a plurality of semiconductor devices connected to said mattress, said semiconductor device including a switching matrix of independently selectable, memorized switching cells, said semiconductor device featuring flip chip technology; said mattress guaranteeing that each element of said workpiece will be touched by at least one electrode of said mattress.

3. An automatic test equipment for testing the functionality of any workpiece placed in any position upon the equipment, comprising a mattress of test electrodes and a plurality of semiconductor devices featuring flip chip technology, and software for testing said workpiece without physical registration; said mattress guaranteeing that each element of said workpiece will be touched by at least one electrode of said mattress.

4. The test equipment of claim 2, wherein said mattress guarantees that each tested element of the workpiece will be touched by at least two electrodes of the said mattress.

5. The test equipment of claim 2, further comprising an extender connected to said semiconductor devices, said mattress being an outer surface of said extender.

6. The test equipment of claim 5, wherein said extender is a pitch translator for adjusting the density of electrodes on said mattress.

7. The test equipment of claim 5, wherein said extender is constructed such that it removes pressure from a portion of the area between said semiconductors and underside of said extender.

8. The test equipment of claim 2, further comprising a compressible layer.

9. The test equipment of claim 2, wherein said electrodes are configured as bumps.

10. The test equipment of claim 2, wherein said electrodes are configured as elastomeric bumps.

11. The test equipment of claim 5, wherein said extender extends horizontally.

12. The test equipment of claim 5, wherein said extender extends vertically.

13. The test equipment of claim 9, wherein said bumps are fabricated using the Precise Printing process.

14. The test equipment of claim 2, wherein said semiconductors are assembled on the extender using the Precise Printing process.

15. The test equipment of claim 2, wherein said electrodes are made up of electrically conductive cushion.

16. The test equipment of claim 3, wherein said mattress guarantees that each tested element of the workpiece will be touched by at least two electrodes of said mattress.

17. The test equipment of claim 2, wherein said switching cells are bi-directional.

* * * * *